United States Patent [19]

Allen

[11] Patent Number: 4,636,714
[45] Date of Patent: Jan. 13, 1987

[54] CAPACITIVE TRANSDUCER AND METHOD

[75] Inventor: Henry V. Allen, Fremont, Calif.

[73] Assignee: Wystron, Inc., Fremont, Calif.

[21] Appl. No.: 572,204

[22] Filed: Jan. 18, 1984

[51] Int. Cl.$^4$ .......................................... G01R 27/26
[52] U.S. Cl. ................................................ 324/60 CD
[58] Field of Search ............ 324/60 CD, 61 R; 73/37; 361/283

[56] References Cited

U.S. PATENT DOCUMENTS

| | | | |
|---|---|---|---|
| 2,607,528 | 8/1952 | McWhirter et al. | 324/60 CD |
| 3,193,803 | 7/1965 | Hoffman | 324/60 CD |
| 3,858,097 | 12/1974 | Polye . | |
| 3,886,447 | 5/1975 | Tanaka | 324/60 CD |
| 3,952,234 | 4/1976 | Birchall . | |
| 4,153,873 | 5/1979 | Grindheim | 324/61 R |
| 4,243,933 | 6/1981 | Rollman | 324/60 CD |
| 4,357,834 | 11/1982 | Kimura . | |

FOREIGN PATENT DOCUMENTS 1140646  12/1962  Fed. Rep. of Germany ........ 324/60 CD

OTHER PUBLICATIONS

"A High-Sensitivity Integrated-Circuit Capacitive Pressure Transducer", Wen H. Ko, et al, pp. 48–56, IEEE Transactions on Electron Devices, Jan. 1982, vol. ED-29, No. 1.

"A Monolithic Capacitive Pressure with Pulse-Period Output", IEEE-ED, C. S. Sander, et al, May 1980, pp. 927–930.

C. D. Fung, et al, "Miniature Capacitive Pressure Transducers", *Sensors and Actuators*, vol. 2, No. 3, Jul. 1982, pp. 321–325.

Dobkin, IC Voltage Reference has 1 PPM Per Degree Drift, Linear Applications, vol. 2, Jun. 1976, pp. AN1-61-1 to AN161-6.

*Primary Examiner*—Stanley T. Krawczewicz
*Attorney, Agent, or Firm*—Fitch, Even, Tabin & Flannery

[57] ABSTRACT

An integrated circuit capacitive transducer measures at least one parameter of a medium to which it is exposed. A variable capacitor has a capacitance which varies as a function of the measured parameter and is charged by a source of reference potential. The charge on the variable capacitor is then transferred to a second capacitor having a fixed reference capacitance. The voltage developed across the second capacitor by the charge transferred thereto is then a function of the capacitance of the first capacitor. Therefore, the voltage is also a function of the parameter being measured. The capacitance transducer may also include a further variable capacitor for measuring the difference of parameters between two mediums.

17 Claims, 6 Drawing Figures

CAPACITIVE TRANSDUCER AND METHOD

The present invention relates generally to capacitive transducers and, more particularly, to a novel method and apparatus for sensing changes in the capacitive charge of a variable capacitor, wherein the capacitance is a function of a varying physical displacement of the capacitor plates with respect to each other or a function of dielectric variations in the capacitor.

One type of a capacitive transducer known in the art generally has a variable capacitor constructed by forming one plate of the capacitor on a substrate and forming the other plate of the capacitor on a membrane, the membrane being movable with respect to the substrate whereby the distance between the plates is variable. The variable capacitor construction forms an isolated cell which contains a gaseous or vacuum medium and, therefore, the capacitor has a nonvarying dielectric constant determined by the medium in the gap between the plates of the variable capacitor. The side of the membrane opposite that of the movable plate is exposed to a medium of which one of its parameters is to be measured. Thus, such a capacitive transducer structured as above described is a particularly useful device for measuring the pressure of a gaseous or liquid medium since the membrane is deflected as a function of the pressure of the medium acting on the membrane. As the pressure of the medium increases, the plates of the capacitor are displaced towards each other which increases the capacitance of the variable capacitor. Similarly, a decrease in pressure increases the spacing between the plates and the capacitance of the variable capacitor decreases. Since the capacitance of the variable capacitor varies as a function of the pressure, the sensing of the capacitive charge enables the membrane pressure to be calculated. Such a capacitive transducer which senses changes in physical displacement of the variable capacitor plates with respect to each other may also be arranged to measure acceleration, displacement, temperature or strain, in addition to pressure.

Another type of capacitive transducer known in the art utilizes a variable capacitor wherein each plate is fixed with respect to each other but the variable capacitor cell is exposed to the medium which is being measured. Thus, capacitance of the variable capacitor varies as a function of changes in the dielectric constant of the medium. Such a capacitive transducer is a particularly useful device for measuring relative humidity of the medium, or its percentage of vacuum.

Since the variable capacitor cell transduces the measured parameter, such as pressure or dielectric variations, to capacitance, a detection circuit is utilized to develop an output signal wherein its amplitude or period, for example, varies as a function of the change in capacitance and, therefore, as a function of change in the parameter being measured. The detection circuit may either be a signal processing circuit external to the capacitive transducer or be integrated therewith.

One such detection circuit known in the art uses a diode bridge configuration to electrically measure the change of the variable capacitor with respect to a reference capacitor. Known diode bridge capacitive transducers are disclosed by Ko, et al., in "A High Density Integrated Circuit Capacitive Pressure Transducer," *IEEE Transactions on Electron Devices*, Vol. Ed. 29, No. 1, Jan., 1982, pp. 48-56 and by Harrison, et al., in "A Two Wire I.C. Compatible Transducer Circuit," *Review of Scientific Instrumentation*, Vol. 41, No. 12, Dec. 1970, pp. 1783-1788. Generally, the diode bridge type of detecting circuit includes the variable capacitor and the reference capacitor each connected to opposite nodes of the bridge and coupled to each other at a ground potential. The other nodes of the bridge are coupled to an AC source through coupling capacitors. Between the nodes to which the coupling capacitors are connected, a differential DC voltage component is developed because of the rectification function of the diode bridge. This differential voltage can then be expressed as a function of the difference between the capacitance of the variable capacitor and the capacitance of the reference capacitor.

A problem and limitation of a diode bridge detecting circuit is that the output voltage is sensitive to voltage drop changes across the diodes caused by changes in temperature and various parasitic capacitances in parallel with the variable and reference capacitors. For example, in the above described publication, the capacitive transducer is described as having a negative temperature coefficient caused by (1) the temperature coefficient of the forward voltage drop in each of the diodes in the diode bridge, (2) the temperature coefficient of the pressure inside the chamber of the reference capacitor, and (3) a mismatch of thermal expansion between the silicon membrane to which one plate of the variable capacitor is mounted and the glass to which the fixed plate of the variable capacitor is mounted. The diode bridge device is also described therein as exhibiting an offset voltage, i.e., a non-zero output voltage, at a reference environmental pressure at which both the variable capacitor and reference capacitor have equal capacitance, and further having a sensitivity which is difficult to control.

A second type of prior art detecting circuit measures the change of period of an oscillator circuit, wherein the change of period is a function of the change of capacitance of the variable capacitor. Thus the period of the output waveform is also a function of the parameter being measured. A circuit for measuring the change of period in an oscillator circuit is described by Sander, et al., in "A Monolithic Capacitive Pressure Sensor with Pulse-Period Output," *IEEE Transactions on Electron Devices*, May, 1980, pp. 927-930. In a pulse mode device, the variable capacitor in the capacitive transducer is charged and discharged between fixed voltage levels by a biasing circuit. The rate of charging of the capacitor is a known function of its capacitance. A Schmitt trigger detecting circuit is triggered when the charge build-up on the variable capacitor causes a preselected triggering voltage to be developed. Thus, the time period of the waveform developed by the Schmitt trigger is directly related to the instantaneous capacitance of the variable capacitor.

However, a disadvantage and limitation of this device is that the leads from the biasing circuitry and into the Schmitt trigger exhibit a parasitic capacitance of the same order of magnitude as the transducer capacitance. Thus, this device is very sensitive to such parasitics existing in the detecting circuit.

Finally, a third type of prior art detecting circuit measures the reactive impedance of the capacitive transducer. Such a detecting circuit applies an AC voltage to the variable capacitor and then measures the AC current through the capacitor. By dividing the AC current by $2\pi$ fv, the instantaneous value of the transducer capacitance may be obtained and the parameter being measured determined therefrom. However, this device also has a disadvantage and limitation in that it is highly sensitive to parasitic capacitances existing in the detecting circuit.

The capacitive transducer of the present invention provides at least one variable capacitor, a reference capacitor and a detection circuit designed for fabrication on a single substrate as a monolithic integrated circuit (IC). The detection circuit of the present invention is a modification of the art of switched capacitor monolithic IC's. For example, in a known switched capacitor device, the output voltage is linearly proportional to an unknown input voltage wherein the constant of proportionality is the ratio of two known capacitances. The present invention modifies the switched capacitor technique by providing that the output voltage is a function of an unknown capacitance wherein the constant of proportionality is the ratio of a reference voltage to a fixed capacitance. Thus, where the unknown capacitance in the switched capacitor IC is the capacitance of the variable capacitor and the fixed capacitance is the capacitance of the reference capacitor of a capacitive transducer, the output voltage is then also a function of the parameter of the medium being measured by the variable capacitor.

It is therefore an object of the present invention to provide a novel apparatus and method for sensing changes in the capacitance of a variable capacitor as a function of changes in physical displacement of the capacitor plates or dielectric variations in the capacitor which overcome one or more of the disadvantages and limitations enumerated hereinabove.

It is a further object of the present invention to provide a novel apparatus and method for sensing changes in the capacitance of a variable capacitor wherein charge stored on the variable capacitor is sampled and coupled to a source of reference potential by transferring such charge to a reference capacitor.

It is another object of the present invention to provide a novel apparatus and method for sensing changes in the capacitance of a variable capacitor wherein this sensing is insensitive to changes in ambient temperature.

It is yet another object of the present invention to provide an apparatus and method for sensing changes in the capacitance of a variable capacitor wherein sensitivity to parasitic capacitances is minimized.

It is still a further object of the present invention to provide a novel method and apparatus for sensing differential changes in the the capacitance of a pair of variable capacitors as a function of differing physical displacement of the capacitor plates of each capacitor or differing dielectric variations of each capacitor.

These and other objects, advantages and features of the present invention will become more apparent from a study of the enclosed drawings, the following specification and the appended claims.

Broadly stated, the present invention is directed to a capacitive transducer wherein a variable capacitor is charged from a source of reference potential. The capacitance of the variable capacitor is a function of one of the parameters of the medium being measured by the transducer. The charge obtained on the variable capacitor is then a function of its instantaneous capacitance and the reference potential. The charge on the variable capacitor is sampled by transferring the charge to a reference capacitor. The resultant voltage of the reference capacitor to maintain this charge is a function of the capacitance of the variable capacitor and, therefore, a function of the parameter of the medium being measured. The reference capacitor is then discharged to prepare it for receiving the next charge from the variable capacitor.

For example, the charge Q obtained on the variable capacitor having an unknown capacitance $C_u$, when charged to have a voltage equal to the reference potential $V_r$, is $$Q = C_u V_r. \tag{1}$$

When the charge Q is transferred to the reference capacitor having a capacitance $C_r$, the voltage $V_c$ developed across the reference capacitor is then given by $$V_c = Q/C_r. \tag{2}$$

By substituting into equation (2) the expressio charge Q in equation (1), the voltage $V_c$ may then be expressed as $$V_c = V_r C_u / C_r. \tag{3}$$

Since, the unknown capacitance $C_u$ of the variable capacitor is a function of the parameter being measured it follows that the voltage $V_c$ developed across the reference capacitor by the charge Q is then a function of the measured parameter.

Of course, the source of reference potential $V_r$ is subject to temperature variations, especially in a monolithic IC and the variable capacitor and reference capacitor have parasitic capacitors associated therewith. The integrated capacitive transducer therefore would normally exhibit temperature and offset errors because of the parasitic terms. However, as will be more fully described hereinbelow, the apparatus and method of the present invention also compensate for these temperature and offset errors.

Figure 1:
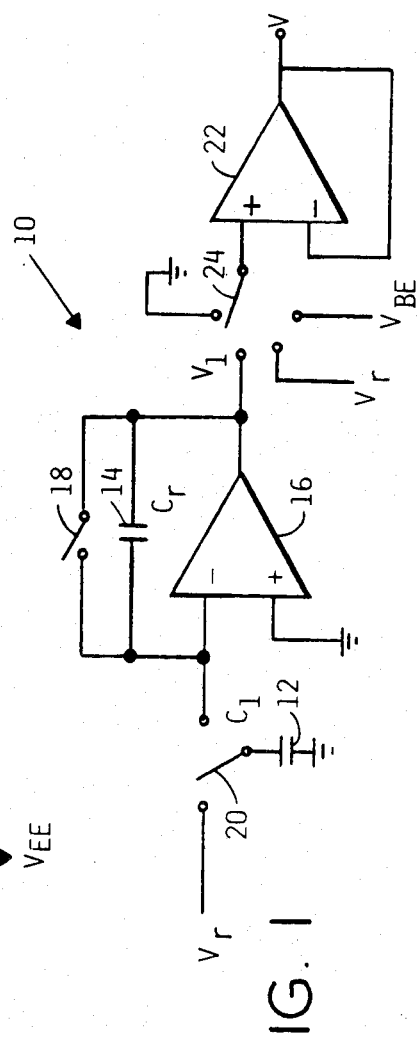
FIG. 1 is a schematic diagram of a capacitive transducer according to the principles of the present invention.

Referring now to FIG. 1, there is shown a schematic diagram of a capacitive transducer 10 constructed according to the principles of the present invention. Capacitive transducer 10 includes a variable capacitor 12, having a capacitance $C_1$, which is selectively charged by a source of reference potential $V_r$, and a reference capacitor 14, having a capacitance $C_r$, to which the charge on variable capacitor 12 is transferred to develop a voltage which is a function of the parameter of the medium being measured. Reference capacitor 14 is a negative feedback capacitor between the inverting input and the output of an amplifier 16. The non-inverting input of amplifier 16 is at ground potential. A switch 18 is coupled in parallel with reference capacitor 14. A switch 20 selectively switches one plate of variable capacitor 12 between the source of reference potential $V_r$ and the inverting input of amplifier 16.

Because the non-inverting input of amplifier 16 is coupled to ground potential, the inverting input thereof is at a virtual ground potential. With switch 18 normally closed and switch 20 coupled to the source of reference potential $V_r$, the output voltage $V_1$ developed by amplifier 16 is equal to its input offset voltage, or $$V_1 = V_{os1}. \quad (7)$$

When switch 20 is coupled to the source of reference potential $V_r$, variable capacitor 12 obtains a level of charge Q as hereinabove described which is given by $$Q = C_1 V_r. \quad (5)$$

After variable capacitor 12 is charged, switch 18 is opened. Switch 20 subsequently couples variable capacitor 12 to the inverting input of amplifier 16. Because the inverting input of amplifier 16 is at a virtual ground potential, the voltage across variable capacitor 12 must, in time, fall ideally to zero, and therefore cannot support any level of charge to remain thereon. However, the inverting input of amplifier 16 differs in voltage from the ideal by the offset voltage $V_{os1}$ of amplifier 16. Thus, not all charge is removed from variable capacitor 12 as is more fully described herein below. The charge Q is therefore transferred to reference capacitor 14 by a feedback current induced from the momentary voltage imbalance across the inputs to amplifier 16. After reference capacitor 14 is charged to have the charge Q thereon, the output voltage developed by amplifier 16 is the offset voltage $V_{os1}$ less the voltage drop across reference capacitor 14 induced by the charge, Q, or $$V_1 = V_{os1} - (V_r - V_{os1})C_1/C_r. \quad (6)$$

The term for the voltage across reference capacitor 14 in equation (6) is determined similarly as described hereinabove in conjunction with the description of the derivation of equation (3). However, the effects of the offset voltage $V_{os1}$ of amplifier 16 prevent all of the charge Q from being transferred to reference capacitor 14.

Capacitive transducer 10 includes means to minimize the effect of input voltage offset error in the output of amplifier 16, which is seen in equation (6), such means including second amplifier 22 and a switch 24 coupled to the non-inverting input of amplifier 22. Switch 24 enables the multiplexing of ground potential and the reference potential $V_r$ with the output voltage $V_1$ of amplifier 16. The inverting input of amplifier 22 is coupled to the output thereof to configure amplifier 22 in a unity gain mode. Switch 24 is selectively positionable between the output of amplifier 16, the source of reference potential $V_r$, a convenient point of ground potential and a temperature voltage reference whose potential $V_{BE}$ is a function of temperature. The output voltage $V_2$, developed by amplifier 22 when switch 24 is coupled to ground potential, is equal to its input offset voltage, or $$V_2 = V_{os2}. \quad (7)$$

Similarly, when switch 24 is coupled to the temperature voltage reference $V_{BE}$, the output of amplifier 22 is the offset voltage plus the potential $V_{BE}$ of the temperature voltage reference, or $$V_2 = V_{os2} + V_{BE}. \quad (8)$$

Accordingly, when switch 24 is coupled to the source of reference potential $V_r$, the output of amplifier 22 is equal to its input offset voltage plus the reference potential $V_r$, or $$V_2 = V_{os2} + V_r. \quad (9)$$

Finally, when switch 24 is coupled to the output of amplifier 16, and the charge of capacitor 12 has been transferred to capacitor 14 as hereinabove described, the output of amplifier 22 is equal to its input offset voltage $V_{os2}$ plus the output voltage $V_1$ of amplifier 16 given by equation (6), or $$V_2 = V_{os2} + V_{os1} - (V_r - V_{os1})C_1/C_r. \quad (10)$$

From the above equations (7)–(10), which express the output voltage $V_2$ of amplifier 22 as a function of one of the four positions of switch 24, any temperature dependent input voltage offset errors can be computed and eliminated from equation (10) so that the corrected output voltage is purely a function of the capacitance $C_1$ of reference capacitor 14. Since the offset voltages $V_{os1}$ and $V_{os2}$ cancel out mathematically from the above expressions, the effects of temperature on the capacitances $C_1$ and $C_r$ can be determined. The compensation for temperature and offset errors is described in greater detail below and will become more apparent from the following description.

In a modified embodiment of the invention described with reference to FIG. 1, variable capacitor 12 could also have one of its plates directly coupled to the inverting input of amplifier 16. The other plate of variable capacitor 12 would then be selectively switchable between the reference potential $V_r$ and the ground potential by means of switch 20. Since the inverting input of amplifier 16 is at virtual ground, variable capacitor 12 will be charged when switch 20 is coupled to the reference potential $V_r$ and discharged to transfer the charge to reference capacitor 14 when switch 20 is coupled to ground potential.

Figure 2:
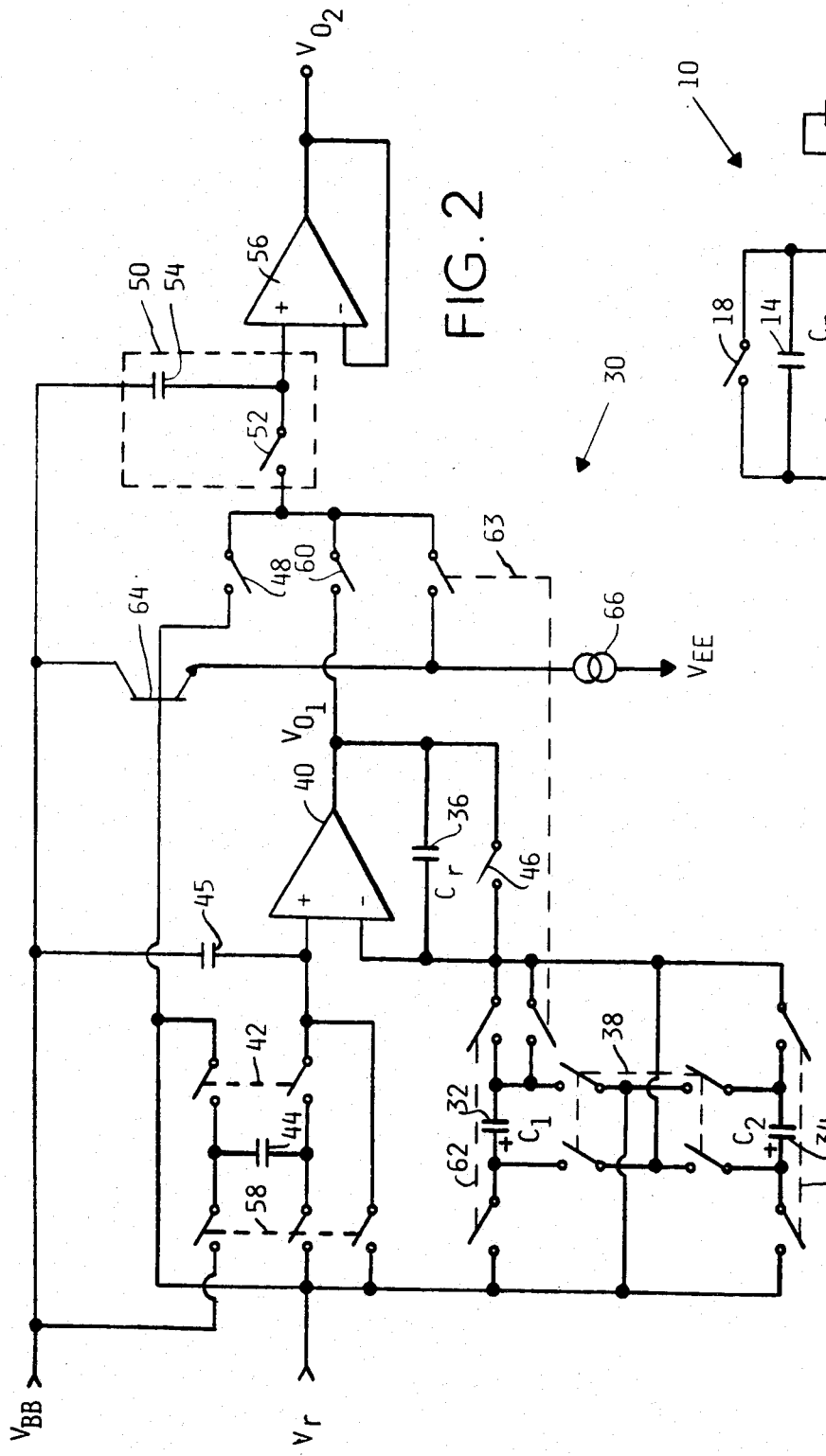
FIG. 2 is a schematic diagram of another embodiment of a capacitive transducer according to the present invention which is useful for measuring differential parameters.

The basic embodiment of the present invention having been disclosed, reference is now made to FIG. 2 which illustrates a differential capacitive transducer 30 which has two variable capacitors for measuring the difference in parameters between two mediums to be measured.

Differential capacitive transducer 30 includes a first variable capacitor 32 having an unknown capacitance $C_1$, a second variable capacitor 34 having an unknown capacitance $C_2$, and a reference capacitor 36 having a fixed capacitance, $C_r$. Generally, each of variable capacitors 32 and 34 are charged from the source of reference potential $V_r$ such that each obtains a charge $Q_1$ and $Q_2$, respectively, as determined by their instantaneous capacitances. The charge $Q_1$ on capacitor 32 and the charge $Q_2$ on capacitor 34 are each transferred to the reference capacitor 36 but with opposite polarity so that the net charge on reference capacitor 36 is the difference between charge $Q_1$ and charge $Q_2$. The net charge on reference capacitor 36 develops a voltage which is a function of the difference of the capacitance $(C_2 - C_1)$ between variable capacitor 32 and variable capacitor 34.

In the preferred embodiment of the present invention, differential capacitive transducer 30 is a monolithic IC fabricated on a silicon substrate wherein the detecting circuit is fabricated as is known in the art for switched capacitor integrated circuits. One particular embodiment of an integrated variable capacitor useful for integration in the detecting circuit is described hereinbelow with reference to FIG. 6.

In a preferred embodiment, capacitive transducer 30 operates at a potential determined from a source line at a voltage $V_{BB}$ and a return line at a voltage $V_{EE}$. The reference potential $V_r$ is selected to have a potential in the mid-range between the source line voltage and return line voltage. In a preferred embodiment of the present invention, the source line voltage $V_{BB}$ is at zero volts, the reference potential $V_r$ is at $-1.2$ volts, and the return line voltage $V_{EE}$ is at $-3$ to $-5$ volts.

To place a charge on each variable capacitor 32 and 34, a switch 38 is closed for coupling each capacitor 32 and 34 in parallel which each other and in series between the source of reference potential $V_r$ and the inverting input of an amplifier 40. Note that amplifier 40 will have an input offset voltage $V_{os1}$ having the same characteristics as described above for amplifier 16. Simultaneously with the closing of switch 38, a switch 42 also closes to couple a capacitor 44 in series between the source of reference potential $V_r$ and the noninverting input of amplifier 40. A second capacitor 45 of equal capacitance to capacitor 44 is coupled between the noninverting input of amplifier 40 and the source line voltage $V_{BB}$. Prior to switch 42 being closed, each capacitor 44 and 45 has an initial charge thereon so that each capacitor develops a voltage equal to the reference potential, $V_r$, with a polarity as indicated in FIG. 2. The initial charging of capacitors 44 and 45 is described hereinbelow. When switch 42 closes, the voltage of the noninverting input of amplifier 40 is stepped up by transferring charge from capacitor 44 to capacitor 45 to a voltage equal to 1.5 $V_r$. To insure that the above voltages are applied across capacitors 32 and 34, a switch 46 is closed to maintain amplifier 40 as a unity gain amplifier and furthermore to prevent any charge from building up on reference capacitor 36. Therefore, as is known in the art, since amplifier 40 is connected to act as a unity gain amplifier this bias voltage at the noninverting input of amplifier 40, reduced by the offset voltage $V_{os1}$, appears at the inverting input of amplifier 40. When switch 38 closes, the voltage across each capacitor 32 and 34 is then equal to $V_r/2$, with a polarity indicated in FIG. 2. Of course, the level of charge $Q_1$ and $Q_2$ on each variable capacitor 32 and 34, respectively, is not necessarily identical because their instantaneous, unknown capacitances $C_1$ and $C_2$ are varying with the parameter of the medium in which each is exposed for measuring. Thus, the level of charge $Q_1$ on first variable capacitor 32 is given by $$Q_1 = C_1 V_r/2 \qquad (11)$$

and the level of charge, $Q_2$, on second variable capacitor 34 is given by $$Q_2 = C_2 V_r/2. \qquad (12)$$

It should be noted that switch 46 is normally closed except for when charge is being transfered to reference capacitor 36, as described hereinbelow. During the acquisition of charge $Q_1$ and $Q_2$ on variable capacitors 32 and 34, respectively, the effects of the offset voltage $V_{os1}$ are not included since, as hereinafter described, the charge $Q_1$ and $Q_2$ is "dumped" to the same node in transducer 30.

Simultaneously while charging variable capacitors 32 and 34, a switch 48 is also closed which couples the source of reference potential $V_r$ to a conventional sample and hold circuit 50, having a sampling switch 52 and a holding capacitor 54. After switch 48 closes, switch 52 closes and opens to sample the reference potential $V_r$ for storage on capacitor 54. The reference voltage is applied to the noninverting input of a unity gain amplifier 56 which develops an output voltage $V_{o2}$ equal to the reference voltage $V_r$ plus the input offset voltage $V_{os2}$ of amplifier 56, or $$V_{o2} = V_r + V_{os2}. \qquad (13)$$

In the preferred embodiment of capacitive transducer 30, the various switches operate in a nonoverlapping mode, for example, one switch must close before another switch operatively connected thereto opens, and further operate in a predetermined sequence. Therefore, further reference is also made to FIG. 3 which illustrates a timing diagram for the switches illustrated in FIG. 2. Note also that it is deemed to be within the ordinary skill in the art to design a controller that generates signals that enable the timely closure of the switches illustrated in FIG. 2 according to the timing diagram of FIG. 3.

Figure 3:
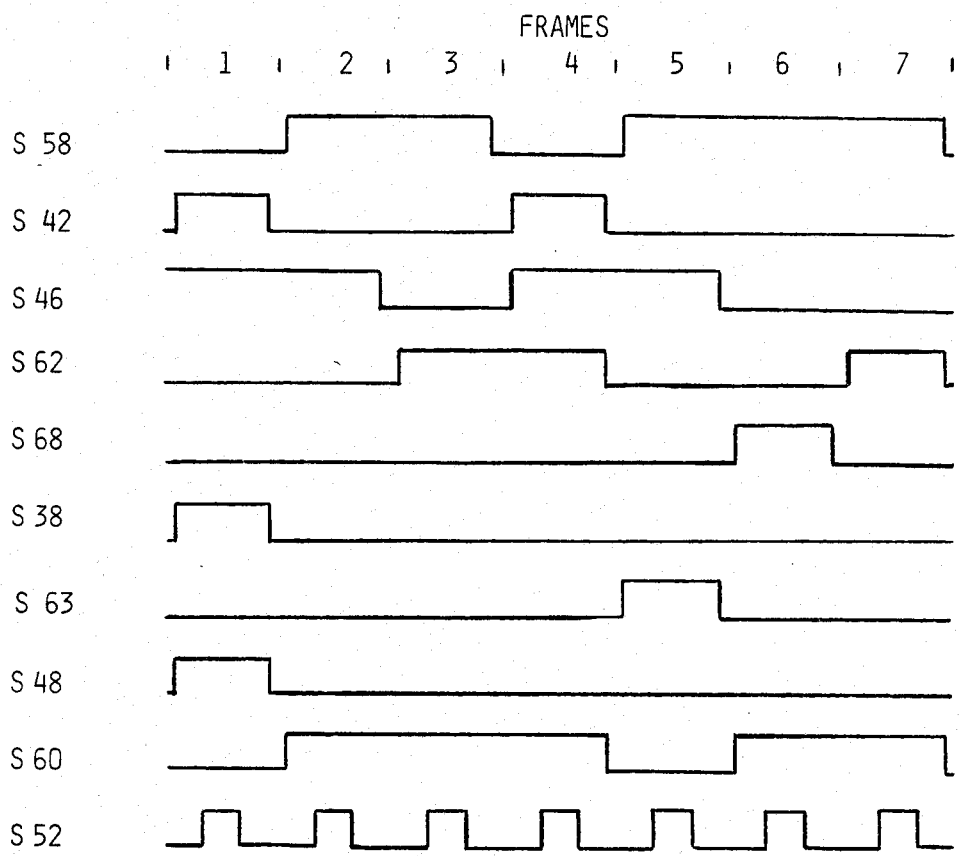
FIG. 3 is a timing diagram associated with the embodiment of the present invention illustrated in FIG. 2.

As seen in FIG. 3, the predetermined switch sequence in the preferred embodiment of transducer 30 comprises seven separate frames (1-7). Each waveform of FIG. 3 represents the varying state of a specific switch, and is identified by an alphanumeric representation which refers to the reference numeral of the associated switch shown in FIG. 2. For example, the representation S48 in FIG. 3 is the timing waveform associated with switch 48 of FIG. 2. Furthermore, the operation of the switches described above can be seen in the timing diagram of FIG. 3 as occurring in a first frame of the seven frame sequence. Note that although switches 38, 42 and 48 may close simultaneously, sampling switch 52 closes and opens while these other switches remain closed.

To terminate the first frame, each of switches 38, 42 and 48 are opened, while switch 46 remains closed. Capacitive transducer 30 is now in condition to begin the second frame. In the second frame, a voltage is developed which allows a measurement of the offset of amplifier 40 to be made prior to any transfer of charge from either of variable capacitors 32 and 34 to reference capacitor 36.

To initiate the second frame, a switch 58 is closed which couples the source of reference potential $V_r$ to the noninverting input of amplifier 40, and further couples each of capacitors 44 and 45 in parallel between the noninverting input of amplifier 40 and ground so that each capacitor 44 and 45 is charged to have a voltage equal to $V_r$ with the polarity shown in FIG. 2. A switch 60 also is closed to couple the output of amplifier 40 to sample and hold circuit 50. During frame 2, amplifier 40 is configured as a unity gain amplifier (switch 46 being closed) so that it develops an output voltage $V_{o1}$ equal to the reference voltage $V_r$ plus the input offset voltage $V_{os1}$ of amplifier 40, or $$V_{o1} = V_r + V_{os1}. \quad (14)$$

After the output of amplifier 40 has stabilized, sample and hold circuit 50 samples, as hereinabove described, the output voltage of amplifier 40 and holds this voltage for application to the non-inverting input of unity gain amplifier 56. The timing of sampling switch 52 may be determined from FIG. 3. Unity gain amplifier 56 develops its output voltage $V_{o2}$ in response to the output voltage $V_{o1}$ stored on capacitor 54 which is then given by $$V_{o2} = V_r + V_{os1} + V_{os2}. \quad (15)$$

After switch 52 is opened, the second frame may be terminated by opening switch 46 to prepare reference capacitor 36 to receive charge from first variable capacitor 32. Switches 58 and 60 remain closed, as indicated by the timing waveforms of FIG. 3.

At the beginning of the third frame, a switch 62 is closed which couples first variable capacitor 32 in series between the source of reference potential $V_r$ and the inverting input of amplifier 40 with a reversed polarity from the similar connection in frame 1 which charged first variable capacitor 32. Switches 58 and 60 remain closed from the prior frame. Since the noninverting input of amplifier 40 is coupled to the source of reference potential, $V_r$, the inverting input of amplifier 40 must also be at a potential approximate to $V_r$. The potential at the inverting input of amplifier 40 differs in potential from the non-inverting input thereof by the offset potential $V_{os1}$ of amplifier 40. Furthermore, since first variable capacitor 32 is coupled in series between the source of reference potential $V_r$ and the inverting input of amplifier 40, first variable capacitor 32 cannot support any charge thereon because the voltage drop across it must be zero. Initially, however, the inverting input of amplifier 40 is at a potential of the source $V_r$ less the voltage drop of one-half $V_r$ across first variable capacitor 32, as hereinabove described. Thus, a current is developed which discharges first variable capacitor 32 and charges reference capacitor 36. Since the quantum of charge on capacitor 32 is transferred by this current to reference capacitor 36, the voltage across reference capacitor 36, as seen from equation (10), is one half the reference voltage $V_r$ multiplied by the ratio of the capacitance $C_1$ of first variable capacitor 32 divided by the capacitance $C_R$ of reference capacitor 36. Amplifier 40 develops an output voltage in response to the voltage across reference capacitor 36 and the reference potential $V_r$ which is equal to the sum of the reference potential $V_r$ and the input offset voltage $V_{os1}$, plus the sum of one half the reference potential $V_r$ multiplied by the ratio of the capacitance $C_1$ divided by the capacitance $C_r$, or $$V_{o1} = V_r + V_{os1} + (V_r/2)C_1/C_r. \quad (16)$$

Switch 52 closes to sample the output voltage for storage on capacitor 54. Amplifier 56 then develops an output voltage which is equal to the output voltage of amplifier 40 given by equation (17) plus the inherent offset voltage $V_{os2}$ of amplifier 56 and given by $$V_{o2} = V_r + V_{os1} + V_{os2} + (V_r/2)C_1/C_r. \quad (17)$$

To terminate the third frame, switch 58 is opened while switches 60 and 62 remain closed.

At the beginning of the fourth frame, each of switches 42 and 46 are closed. The closing of switch 42 couples capacitor 44 in series between the source of reference potential $V_r$ and the noninverting input of amplifier 40. Because capacitor 44 already is charged to a voltage equal to the reference potential $V_r$ some of the charge is transferred to capacitor 45 until the voltage across each capacitor 44 and 45 is equal with the voltage at the noninverting input of amplifier 40 being substantially equal to 1.5 $V_r$. The closing of switch 46 discharges reference capacitor 36, and since switch 62 has remained closed, the charge on reference capacitor 36 is transferred back to variable capacitor 32 which again develops a voltage equal to one half the reference potential $V_r$ but with an opposite polarity from its initial charge in frame 1. This "backcharging" of capacitor 32 is useful for charge subtraction from the charge of second variable capacitor 34 as hereinbelow described.

Since amplifier 40 is in the unity gain mode, its output is equal to 1.5$V_r$, being the voltage at its noninverting input plus its input offset voltage $V_{os1}$ of amplifier 40, or $$V_{o1} = 1.5V_r + V_{os1}. \quad (18)$$

The output voltage of amplifier 40 is coupled through switch 60 to sample and hold circuit 50, which samples the output voltage in accordance with the waveform S52 in FIG. 3. The voltage $V_{o1}$ stored on capacitor 54 is applied to unity gain amplifier 56 whose output voltage $V_{o2}$ is the output voltage $V_{o1}$ of amplifier 40 plus the input offset voltage $V_{os2}$ of amplifier 56, or, $$V_{o2} = 1.5V_r + V_{os1} + V_{os2}. \quad (19)$$

As seen from the waveforms in FIG. 3, the fourth frame is terminated by opening switches 42, 60 and 62 while switch 46 remains closed.

To initiate the fifth frame, as seen by the timing waveforms in FIG. 3, a switch 63 is closed which couples the emitter of a transistor 64 to sample and hold circuit 50 and further couples one plate of first variable capacitor 32 to the inverting input of amplifier 40. The other plate of variable capacitor 32 remains at a floating potential. Furthermore, switch 58 closes with switch 46 remaining closed from the prior frame. The closing of switch 58 recharges each capacitor 44 and 45 to have a voltage equal to the reference potential $V_r$. When switch 63 closes, the voltage applied to sample and hold circuit 50 is equal to the source of reference potential $V_r$ less the forward bias voltage $V_{BE}$ of the pn junction between the base and the emitter of transistor 64. The emitter current of transistor 64 is held constant by a current source 66. In the preferred embodiment, current source 66 is coupled between the emitter of transistor 64 and the lower bias potential $V_{EE}$. Because the emitter current of transistor 64 is constant, the forward bias voltage $V_{BE}$ is a function of temperature only. When capacitive transducer 30 is fabricated as a monolithic IC, the forward bias voltage, $V_{BE}$, provides a means for measuring the temperature of the substrate to compensate for structurally related drifts. The temperature transduced by the measurement of $V_{BE}$ may also be used in higher order data computations such as viscosity and heat loss in pressure gradients, for example. Since capacitive transducer 30 is preferably designed for integration on a silicon substrate, it is desirable that certain parasitic capacitances are shorted out by switch 63 during the measurement of temperature voltage, $V_{BE}$. These parasitic capacitances may be compensated for by coupling one plate of first variable capacitor 32 to the inverting input of amplifier 40 by means of switch 63.

During the fifth frame, emitter voltage of transistor 64 is sampled by sample and hold circuit 50 as indicated in the timing waveform of FIG. 3. Unity gain amplifier 56 develops its output voltage $V_{o2}$ equal to the reference potential $V_r$ less the forward bias voltage $V_{BE}$ plus the input offset voltage $V_{os2}$ of amplifier 56, or $$V_{o2} + V_r - V_{BE} + V_{os2}. \qquad (20)$$

The fifth frame is terminated by opening each of switches 46 and 63.

At the beginning of the sixth frame, as seen by the timing waveforms in FIG. 3, a switch 68 closes to couple the second variable capacitor 34 in series between the source of reference potential, $V_r$, and the inverting input of amplifier 40, and switch 60 closes to couple the output of amplifier 40 to sample and hold circuit 50. Switch 58 remains closed from the prior frame. The charge on second variable capacitor 34 is transferred to the reference capacitor 36 in a similar manner as described above with reference to first variable capacitor 32 when switch 62 closes in the third frame. The development of output voltage $V_{o1}$ of amplifier 40 is therefore analogous to the output voltage $V_{o1}$ developed during the third frame except that the capacitance coefficient $C_2$ appears in the expression of the output voltage instead the capacitance term $C_1$ of equation (22), thus in the sixth frame, the output voltage $V_{o1}$ of amplifier 40 becomes $$V_{o1} = V_r + V_{os1} + (V_r/2)C_2/C_r. \qquad (21)$$

Sample and hold circuit 50 samples the output of amplifier 40 so that amplifier 56 develops its output voltage equal to the output voltage $V_{o1}$ of amplifier 40 plus the input offset voltage $V_{os2}$ whereby $$V_{o2} = V_r + V_{os1} + V_{os2} + (V_r/2)C_2/C_r. \qquad (22)$$

To terminate the sixth frame, switch 68 is open, while switches 58 and 60 remain closed.

In the seventh frame, a voltage across reference capacitor 36 proportional to the difference between the capacitances $C_1$ and $C_2$ is developed by closing switch 62 while switch 46 remains open. This has the effect of again transferring the charge $Q_1$ from first variable capacitor 32 to reference capacitor 36 which has already been charged by the quantum of charge $Q_2$ from second variable capacitor 34. However, since the charge $Q_1$ on capacitor 32 is of reverse polarity with respect to the charge $Q_2$ that has been transferred from capacitor 34, the net charge on reference capacitor 36 is equal to the difference between charge $Q_1$ and charge $Q_2$. The output voltage $V_{o1}$ developed by amplifier 40 is generated similarly as described during the sixth frame except that the capacitive ratio reflects the difference of capacitances $C_2 - C_1$ instead of $C_2$ alone as seen in equation (27), or $$V_{o1} + V_r + V_{os1} + (V_r/2)(C_2 - C_1)/C_r. \qquad (23)$$

The output voltage $V_{o2}$ developed by amplifier 56 after the output of amplifier 40 has been sampled by sample and hold circuit 50 in the seventh frame is then equal to the output voltage $V_{o1}$ plus the input offset voltage $V_{os2}$ or $$V_{o2} = V_r + V_{os1} + V_{os2} + (V_r/2)(C_2 - C_1)/C_r. \qquad (24)$$

To terminate the seventh frame, switches 58, 60 and 62 are opened. The seventh frame terminates one complete cycle of operation of capacitive transducer 30. The sequence described for frames 1–7 may then be repeated for continuous operation of capacitive transducer 30.

Figure 4:
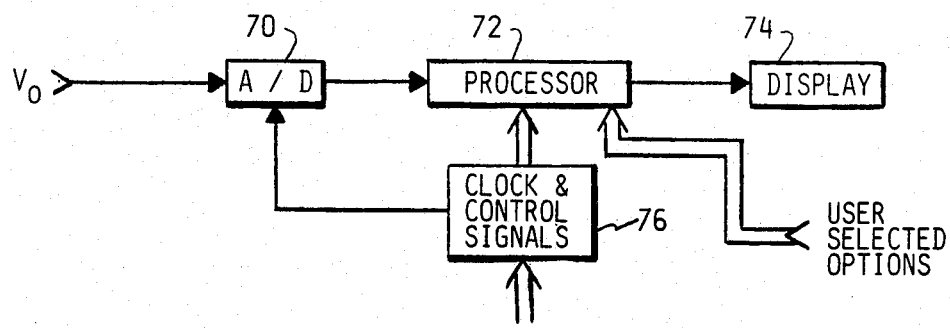
FIG. 4 is a schematic block diagram of a circuit for utilizing the output voltage developed by the capacitive transducer of FIG. 2.

Referring now to FIG. 4, there is shown an analog-to-digital (A/D) converter 70 which converts the analog output voltage $V_{o2}$ developed by amplifier 56 into a digital signal. The digital signal is applied to a digital processor 72 to make computations based on the output voltage as hereinbelow described. Processor 72 then develops a digital output signal which is applied to a display 74. A clock and control signals generator 76 develops the appropriate timing and control signals for synchonization of A/D converter 70 and processor 72 to the operating sequence of successive frames of capacitor transducer 30. The clock and control signals may be generated in response to the switch control signals illustrated by the timing diagram of FIG. 3. Display 74 may be any known alphanumeric character display or an analog gauge. However, if the output signal of processor 72 is a digital signal, such digital signal would have to be first converted to an analog signal for use by an analog gauge.

A/D convertor 70, processor 72, generator 76 and display 74 are not part of capacitive transducer 30, but illustrate an exemplary means for calculating the measurement of the parameter(s) of the medium being measured from the output voltage $V_{o2}$ of amplifier 56 and obtaining the measurement in human readable form.

Figure 5:
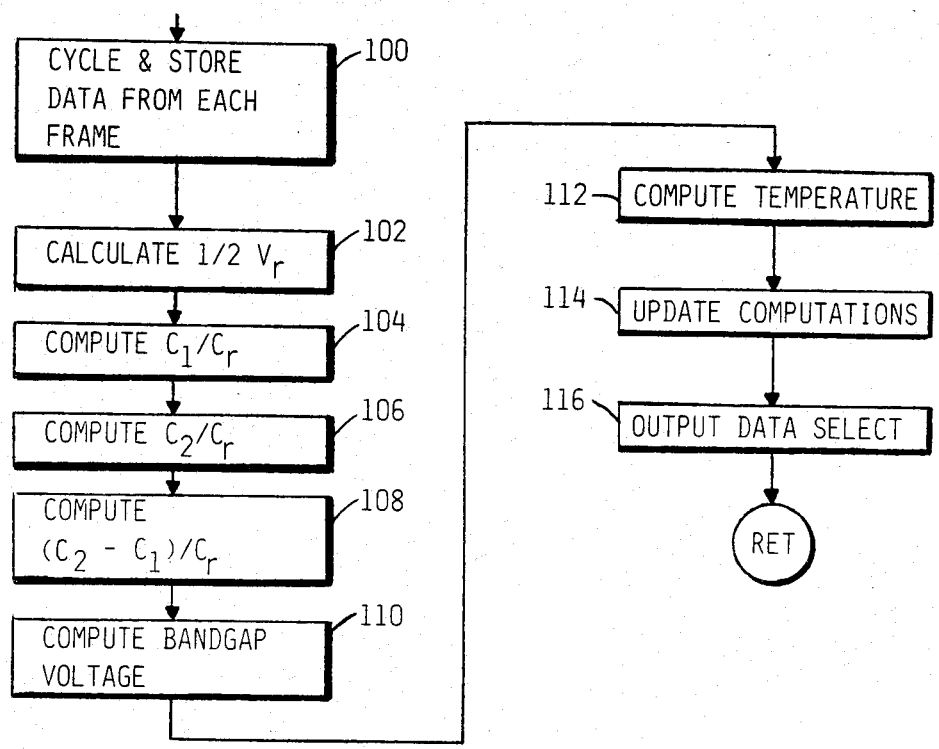
FIG. 5 is a flow chart illustrating the sequence of operation of the circuit of FIG. 4.

Referring now also to FIG. 5 there is shown a flow chart of the computational steps executed by processor 72. Of course, processor 72 need not be a digital processor as described, but any analog numerical operators may be used which are programmed as hereinbelow described to develop the appropriate output voltages for application to display 74. The flow chart described implements one preferred embodiment using capacitive transducer 30 of the present invention. However, these steps need not be performed in the order shown nor all of them performed. For example, the steps hereinbelow described are for calculating a differential pressure between two mediums. However, the steps are also useful for obtaining a measurement of the pressure of either such medium, or with modifications which would be obvious to one skilled in the art, other parameters of such medium may be measured. Processor 72 may also be responsive to selected signals developed in response to user selected options to perform only the desired calculations. Furthermore, the computations described also indicates minor variations, the processing the output voltage developed by amplifier 22 of capacitive transducer 10 described with reference to FIG. 1.

At 100, it is indicated that capacitive transducer 30 is cycled through each of the frames as hereinabove described and that the output voltage developed by unity gain amplifier 56 during each frame is stored. Of course, in the preferred embodiment of the present invention, the output voltage of amplifier 56 is first digitized by A/D converter 70 and stored as data in a memory associated with processor 72. Once the data from each frame is stored, a calculation is made to determine one half the voltage reference, as indicated at 102. In computing one half the voltage reference, the data obtained in frame 2 is subtracted from the data obtained in frame 4. As can be clearly seen by subtracting equation (19) from equation (15), the remaining term is one half the voltage reference. After the subtraction is performed, it is indicated at 104 that the ratio of the capacitance $C_1$ of first variable capacitor 32 to the reference capacitance $C_r$ of reference capacitor 36 is computed. This ratio is computed by subtracting the output voltage data obtained during frame 2 from the output voltage data obtained in frame 3 to eliminate the effects of the reference potential and the offset of amplifiers 40 and 56 from the digitized output voltage data obtained in frame 3. This subtraction results in the capacitance ratio $C_1/C_r$ with a coefficient of $V_r/2$. A division is performed to cancel this coefficient. The denominator for the division is obtained by subtracting the data obtained in frame 2 from the data obtained in frame 4. The computation of the capacitance ratio $C_1/C_r$ performed at 104 may also be stated by reference to equation number as ((17)-(13))/((19)-(15)). Similarly, at 106, the capacitance ratio $C_2/C_r$ is obtained by subtracting the output data of frame 2 from the output data of frame 6 and dividing to obtain the capacitance ratio $C_2/C_r$. Furthermore, at 108, the difference between the capacitances $C_2$ and $C_1$ are obtained by subtracting the output of frame 2 from frame 7 and taking the ratio of these differences respectively. The computations indicated at 106 and 108 are similar to the computations at 104, and are indicated mathematically by reference to equation number as ((22)-(15))/((19)-(15)), and ((24)-(15))/((19)-(15)), respectively.

Once these ratios of the capacitances have been determined, at 110, it is indicated that a band gap reference voltage is computed. The band gap voltage reference is computed by taking the average of the output of the first frame with a similar measurement made at another point in time, which determines any drift of the reference voltage. The band gap voltage reference is a computation to compensate for drifts in the reference potential $V_r$ when the source of the reference potential is integrated in an MOS IC. The accuracy of the computed capacitive ratios is of course dependent on the stability of the source of the reference potential. See Widlar, "Developments in IC Voltage Regulators", *IEEE Journal Solid State Circuits*, Vol. SC-6, pp. 2, February, 1971, which is incorporated herein by reference.

At 112, it is indicated that the substrate temperature is computed from the measurement of the temperature voltage $V_{BE}$. To obtain data relating only to the temperature voltage $V_{BE}$, the output data of frame 1 is subtracted from the output data of frame 5 which results in data which is a measurement of the temperature voltage $V_{BE}$ and expressed by reference to equation number as (20)-(13). The measurement of the temperature voltage $V_{BE}$ is then subtracted from the band gap voltage reference to obtain a Kelvin based temperature dependent voltage. The temperature dependent voltage obtained is useful for compensating for changes in capacitance of the capacitors 32, 34 and 36 which are a function of temperature. Thus, this temperature dependent voltage compensates for structure related drifts in capacitive transducer 30.

At 116, output data select indicates that any of the output ratios computed at 104-108 may be selected, and the data reflecting these ratios displayed on display 74.

Of course, these ratios which are a function of the capacitance of a variable capacitor or difference of capacitances, must be further processed by processor 74, as hereinabove described, to obtain the measurement of the parameter of the medium being measured. Such further processing enables processor 74 to output data which is a function of capacitance and a measurement of the desired parameter as hereinabove described with reference to equation (7).

Figure 6:
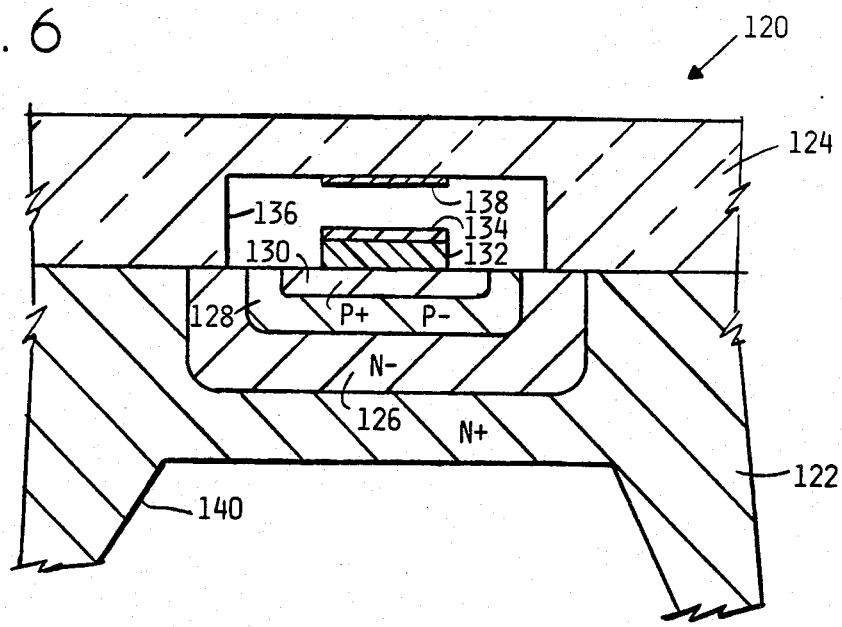
FIG. 6 illustrates an exemplary integrated circuit pressure sensitive variable capacitor cell useful for integration in the capacitive transducer of FIG. 2.

Referring now to FIG. 6, there is shown an exemplary pressure sensitive variable capacitor cell 120 useful for integration of capacitive transducer 30. Cell 120 includes a silicon substrate 122, which is also the substrate for the circuit shown in FIG. 2, and a glass cover 124 hermetically sealed to substrate 122. Substrate 122 is shown to be of n+ silicon with a region 126 of n− silicon. Disposed within region 126 is a further region 128 of p− silicon with a region 130 of p+ silicon disposed in region 128. An oxide layer 132 is grown on the p+ region 130. Disposed on oxide layer 132 is a metal deposition 134 which functions as the movable plate of the variable capacitor. Glass cover 124 includes an etched opening 136, to which a second metal deposition 138 is disposed on its upper wall to function as the fixed plate of the variable capacitor.

Substrate 122 further includes an etched opening 140 disposed below the movable plate of the variable capacitor so that the reduced thickness portion of substrate 122 forms a membrane. Since the etched opening in the glass cover and the substrate form a hermetically sealed chamber, pressure variations to which the etched opening in the substrate is exposed will cause the membrane to move resulting in variations of the distance separating each of the capacitive plates which are formed by the metal depositions.

A capacitor cell to provide the fixed, reference capacitance is constructed similarly to cell 120 except for the omission of etched opening 140 which eliminates the membrane. Another capacitive cell without the membrane but wherein etched opening 136 communicates with the medium external to the capacitor cell provides a variable capacitor whose capacitance is a function of the dielectric constant of the medium.

Although the present invention has been described with reference to a particular and preferred embodiment thereof, it is obvious that numerous uses to and modifications of the described embodiments may be made by those skilled in the art without departing from the inventive concepts disclosed herein. Accordingly, the present invention is to be defined and limited solely by the scope of the appended claims.

What is claimed is:

1. A capacitive transducer for measuring the difference between at least one parameter of a first medium and at least one parameter of a second medium to which said transducer is exposed, said transducer comprising:
   a source of reference potential;
   a first capacitor having a capacitance which varies as a function of said parameter of said first medium;
   a second capacitor having a capacitance which varies as a function of said parameter of said second medium;
   means for selectively charging said first capacitor and said second capacitor to obtain a charge on each said capacitor determined by its instantaneous capacitance and said reference potential;
   a third capacitor having a fixed, reference capacitance; and means for transferring substantially all of said charge on said first capacitor to said third capacitor and for transferring substantially all of said charge on said second capacitor with a polarity opposite from said charge on said first capacitor to said third capacitor, said third capacitor developing a voltage as a function of the difference between said capacitance of said first capacitor and said second capacitor when said charge is transferred thereto.

2. A capacitive transducer as set forth in claim 1 wherein said transferring means includes:
an amplifier having an inverting input, a non-i-verting input and an output, said third capacitor being coupled between said output and one of said inverting input and said non-inverting input;
means for reversing the polarity of said charge on one of said first capacitor and said second capacitor; and
means for sequentially coupling and decoupling said first capacitor and said second capacitor to said one of said inverting input and said non-inverting input.

3. A capacitive transducer as set forth in claim 2 further including means for discharging said third capacitor to remove all of said charge prior to said first and second capacitor being coupled to said amplifier input.

4. An integrated circuit capacitive transducer for measuring at least one parameter of a medium to which said transducer is exposed, said transducer comprising:
a source of reference potential;
a first capacitor having a first plate, a second plate and a capacitance which varies as a function of said parameter;
means for developing a second potential as a function of said reference potential;
means for selectively enabling the potential of a selected point in said transducer to be substantially equal to one of said reference potential and said second potential;
means for charging said first capacitor, including means for selectively coupling said first plate of said first capacitor to said reference potential and means for selectively coupling said second plate of said first capacitor to said selected Point when said selected point is enable to be substantially equal to said second potential, to obtain a charge on said first capacitor as a function of its instantaneous capacitance and the difference between said reference potential and said second potential;
a second capacitor having a first plate, a second plate and a fixed, reference capacitance; and
means for transferring said first capacitor charge to said second capacitor, including means for selectively coupling said first plate of each of said first capacitor and said second capacitor to said selected point when said selected point is enabled to be substantially equal to said reference potential and means for coupling the said second plate of said first capacitor to said reference potential, said second capacitor developing a voltage as a function of said capacitance of said first capacitor when said charge is transferred thereto, said transferring means further including an amplifier having a non-inverting input, an inverting input, and an output, said second plate of said second capacitor being coupled to said output, said selected point in said transducer being coupled to said inverting input; and wherein said first capacitor charging means includes means for selectively operating said amplifier in a unit gain mode during said charging of said first capacitor and wherein said amplifier includes an input offset voltage existing between said inverting and non-inverting inputs, said charging means causing the charge on said first capacitor to be a function of said input offset voltage, said transferring means causing the charge on said first capacitor resulting from said input offset voltage to be reversed in polarity when said first capacitor charge is transferred to said second capacitor, such that the effects of said input offset voltage are eliminated from said first charge upon transferring of said charge.

5. The capacitive transducer as set forth in claim 4 wherein the output voltage of said amplifier during said unity gain mode is a function of said input offset voltage, and the output voltage of said amplifier when not in said unity gain mode is a function of the voltage across said second capacitor and said input offset voltage, the output voltage of said amplifier when in said unity gain mode enabling subsequent correction of input offset voltage error of the output voltage of said amplifier when not in said unity gain mode.

6. An integrated circuit capacitive transducer for measuring the difference between at least one parameter of a first medium and at least one parameter of a second medium to which said transducer is exposed, said transducer comprising:
a source of reference potential;
a first capacitor having a first plate, a second plate and capacitance which varies as a function of said parameter of said first medium;
a second capacitor having a first plate, a second plate and capacitance which varies as a function of said parameter of said second medium;
means for developing a second potential as a function of said reference potential;
means for selectively enabling a selected point in said transducer to be substantially equal to one of said reference potential and said second potential;
means for selectively charging said first capacitor and said second capacitor, including means for coupling said first plate of each of said first capacitor and said second capacitor to said reference potential and means for coupling said second plate of each of said first capacitor and said second capacitor to said selected point when said selected point is enabled to be substantially equal to said second potential, to obtain a charge on each said capacitor as a function of its instantaneous capacitance and the difference between said reference potential and said second potential;
means for reversing polarity of the charge on one of said first capacitor and said second capacitor;
a third capacitor having a first plate, a second plate and a fixed, reference capacitance; and
means for transferring said charge on each of said first capacitor and said second capacitor to said third capacitor, including means for coupling the first plate of said third capacitor and the first plate of each of said first capacitor and said second capacitor to said selected point when said selected point is enabled to be substantially equal to said reference potential, and means for coupling the second plate of each of said first capacitor and said second capacitor to said reference potential, said third capacitor developing a voltage as a function of the difference in capacitance between said first capacitor and said second capacitor when said charge is transferred thereto.

7. The capacitive transducer as set forth in claim 6 wherein said transferring means includes an amplifier having a noninverting input, an inverting input, and an output, the second plate of said third capacitor being coupled to said output, said selected point being coupled to said inverting input; and wherein said first and second capacitor charging means includes means for selectively operating said amplifier in a unity gain mode during said charging of each of said first capacitor and said second capacitor.

8. The capacitive transducer as set forth in claim 7 wherein said enabling means further comprises means for selectively coupling said one of said reference potential and said second potential to said non-inverting input.

9. The capacitive transducer as set forth in claim 7 wherein said amplifier includes an input offset voltage existing between said inverting and said non-inverting inputs, said charging means causing the charge on each of said first capacitor and said second capacitor to be a function of said input offset voltage, said transferring means causing the charge on said first and second capacitors resulting from said input offset voltage to be reversed in polarity when said charge of each of said first capacitor and said second capacitor is transferred to said third capacitor, such that the effects of said input offset voltage are eliminated from the charge on said first and second capacitor upon said transferring thereof.

10. The capacitive transducer as set forth in claim 9 wherein the output voltage of said amplifier during said unity gain mode is a function of said input offset voltage, and the output voltage of said amplifier when not in said unity gain mode is a function of the voltage across said third capacitor and said input offset voltage, the output voltage of said amplifier when in said unity gain mode enabling the subsequent correction of the input offset voltage error of the output voltage of said amplifier when not in said unity gain mode.

11. The capacitive transducer as set forth in claim 6 further comprising:
means for measuring the substrate temperature of said integrated circuit capacitive transducer for enabling the subsequent correction of temperature dependent errors in the capacitance of each of said first capacitor, said second capacitor and said third capacitor.

12. The capacitive transducer as set forth in claim 11 wherein said measuring means includes:
a transistor integrated on the substrate of said transducer and having a base and an emitter; and
means for maintaining the emitter current of said transistor substantially constant, said base being coupled to said source of reference potential, the emitter voltage of said transistor being a function of the temperature of said substrate.

13. The capacitive transducer as set forth in claim 12 wherein said maintaining means includes a constant current source coupled to the emitter of said transistor.

14. A method for measuring the difference between at least one parameter of a first medium and at least one parameter of a second medium, said method comprising the steps of:
providing a source of reference potential;
developing a second potential as a function of said reference potential;
providing an amplifier having an inverting input, a non-inverting input and an output;
selectively charging a first capacitor and a second capacitor by coupling a first plate of each of said first capacitor and said second capacitor to said reference potential, by coupling a second plate of each of said first capacitor and said second capacitor to one of said inverting input and said non-inverting input and by coupling said second potential to the other of said inverting input and said non-inverting input, the capacitance of said first capacitor varying as a function of the parameter of said first medium, the capacitance of said second capacitor varying as a function of the parameter of said second medium;
reversing the polarity of the charge on one of said first capacitor and said second capacitor;
transferring the charge on each said first and second capacitor to a third capacitor having a fixed reference capacitance by coupling the first plate of said third capacitor to said one of said inverting input and said non-inverting input and to the first plate of each of said first capacitor and said second capacitor, by coupling the second plate of each of said first capacitor and said second capacitor to said reference potential, and by coupling said reference potential to said other of said inverting input and said non-inverting input, said second plate of said third capacitor being coupled to said output, said third capacitor developing a voltage as a function of the difference of capacitance between said first capacitor and said second capacitor when said charge is transferred thereto.

15. An integrated curcuit capacitive transducer for measuring at least one parameter of a medium to which said transducer is exposed, said transducer comprising:
a source of reference potential;
a first capacitor having a capacitance which varies as a function of said parameter;
a second capacitor having a fixed, reference capacitance;
a first amplifier having a first input, a second input and an output, said second capacitor being coupled between said first input and said output, said second input being coupled to ground potential;
first switch means for normally coupling said first capacitor between said reference potential and said ground potential to obtain a charge on said first capacitor determined by its instantaneous capacitance and said reference potential, and for selectively coupling said first capacitor between said first input of said amplifier and said ground potential;
second switch means for normally coupling said first input to said output, whereby said second capacitor is discharged and said output develops a voltage substantially equal to the input offset voltage of said amplifier, and for selectively decoupling said first input from said output immediately prior to said first switch means coupling said first capacitor to said first input whereby substantially all of said charge on said first capacitor is transferred to said second capacitor, said second capacitor thereby developing a voltage as a function of the capacitance of said first capacitor when said charge is transferred, said output developing a voltage as a function of each of the input offset voltage of said amplifier and the voltage developed by said second capacitor;

means for eliminating the effect of the input offset voltage of the voltage developed at said output.

16. A capacitive transducer as set forth in claim 15 wherein said minimizing means includes:

a unity gain amplifier having an input and an output;

third switch means for selectively coupling said input of said unity gain amplifier between each of said output of said first amplifier, said reference potential, said ground potential and a temperature reference potential to obtain an output voltage as a function of each of said reference potential, ground potential and temperature reference potential whereby the voltage developed by said output of said first amplifier can be corrected.

17. A capacitive transducer set forth in claim 15 wherein said first input is an inverting input of said amplifier and said second input is a non-inverting input of said amplifier.

* * * * *